(12) United States Patent
Kuo (10) Patent No.: US 8,861,652 B2
(45) Date of Patent: Oct. 14, 2014

(54) DETECTING FORMAT OF A TRANSPORT CHANNEL

(75) Inventor: Chuan-Hsuan Kuo, San Diego, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 13/436,845

(22) Filed: Mar. 31, 2012

(65) Prior Publication Data

US 2013/0142223 A1 Jun. 6, 2013

Related U.S. Application Data

(60) Provisional application No. 61/568,868, filed on Dec. 9, 2011, provisional application No. 61/565,864, filed on Dec. 1, 2011.

(51) Int. Cl.
H04L 27/06 (2006.01)

(52) U.S. Cl.
USPC ........... 375/341; 375/262; 375/265; 704/242; 714/792; 714/795

(58) Field of Classification Search
None
See application file for complete search history.

(56) References Cited

U.S. PATENT DOCUMENTS

| | | | |
|---|---|---|---|
| 6,643,318 B1 | 11/2003 | Parsa et al. | |
| 7,957,758 B2 | 6/2011 | Soerensen et al. | |
| 8,179,946 B2 | 5/2012 | Roberts et al. | |
| 8,320,318 B2 | 11/2012 | Baker et al. | |
| 8,670,509 B2 | 3/2014 | Sollenberger et al. | |
| 2001/0040916 A1* | 11/2001 | Sato | 375/150 |
| 2004/0081115 A1 | 4/2004 | Parsa et al. | |
| 2004/0199858 A1* | 10/2004 | Becker et al. | 714/795 |
| 2004/0264497 A1 | 12/2004 | Wang et al. | |
| 2005/0113087 A1 | 5/2005 | Rick et al. | |
| 2007/0165567 A1 | 7/2007 | Tan et al. | |
| 2007/0243848 A1 | 10/2007 | Behzad | |
| 2008/0298325 A1 | 12/2008 | Vujcic | |
| 2009/0175205 A1* | 7/2009 | Mathew et al. | 370/281 |
| 2009/0207746 A1 | 8/2009 | Yuan et al. | |
| 2009/0225918 A1 | 9/2009 | Telukuntla et al. | |
| 2009/0252125 A1 | 10/2009 | Vujcic | |
| 2011/0064122 A1 | 3/2011 | Hahm et al. | |
| 2012/0134293 A1* | 5/2012 | Nistor et al. | 370/253 |

(Continued)

OTHER PUBLICATIONS

Dielissen, et al., "State Vector Reduction for Initailization of Sliding Windows Map," Proc 2nd International Symposium on Turbo Codes & Related Topics, Sep. 2000, pp. 387-390.

*Primary Examiner* — Adolf Dsouza
(74) *Attorney, Agent, or Firm* — McDermott Will & Emery LLP (57) ABSTRACT

A system and method for determining a transport format of a transport channel is described. A guiding stream is received on a guiding transport channel and a guided stream is received on a guided transport channel. The guided stream is convolutionally decoded to produce a plurality of Viterbi path metrics. A transport format for the guided transport channel is selected from possible transport formats. The possible transport formats are determined by information provided on the guiding transport channel. The selection of the transport format is based at least in part on a metric computed from a combination of the Viterbi path metrics.

20 Claims, 7 Drawing Sheets

(56) References Cited

U.S. PATENT DOCUMENTS

| | | |
|---|---|---|
| 2013/0141257 A1 | 6/2013 | Chiu et al. |
| 2013/0142057 A1 | 6/2013 | Molev-Shteiman |
| 2013/0142061 A1 | 6/2013 | Kuo et al. |
| 2013/0143554 A1 | 6/2013 | Hahm et al. |
| 2013/0143577 A1 | 6/2013 | Chiu et al. |
| 2013/0143605 A1 | 6/2013 | Chiu et al. |
| 2013/0301581 A1 | 11/2013 | Johansson et al. |
| 2013/0322386 A1 | 12/2013 | Zhang et al. |

* cited by examiner

DETECTING FORMAT OF A TRANSPORT CHANNEL

CROSS REFERENCE TO RELATED APPLICATIONS

This application claims priority to U.S. provisional application Ser. No. 61/565,864, entitled "Cellular Baseband Processing," filed Dec. 1, 2011, which is incorporated herein by reference in its entirety. This application also claims priority to co-pending U.S. Provisional application Ser. No. 61/568,868, entitled "Cellular Baseband Processing," filed Dec. 9, 2011, which is incorporated herein by reference in its entirety.

BACKGROUND

Cellular wireless communication systems support wireless communication services in many populated areas of the world. While cellular wireless communication systems were initially constructed to service voice communications, they are now called upon to support data communications as well. The demand for data communication services has exploded with the acceptance and widespread use of the Internet. While data communications have historically been serviced via wired connections, cellular wireless users now demand that their wireless units also support data communications. Many wireless subscribers now expect to be able to "surf" the Internet, access their email, and perform other data communication activities using their cellular phones, wireless personal data assistants, wirelessly linked notebook computers, and/or other wireless devices. The demand for wireless communication system data communications will only increase with time. Thus, cellular wireless communication systems are currently

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

The present disclosure relates to wireless communications, and more specifically to wireless communications using transport channels and transport formats. A transport format specifies a set of parameters used by a transport channel, such as coded block size, coding rate, coding scheme, and so on. A receiver must determine the transport format to correctly process data receive on the transport channel. Wireless systems convey transport format information between transmitter and receiver in various ways. In some scenarios, the transport format is conveyed on a physical channel. In other scenarios, the transport format is not directly conveyed to the receiver, and the receiver instead detects the format by analyzing data received on the channel according some characteristic, such as power ratios, or cyclic redundancy check (CRC) errors.

In still other scenarios, the transport format of one channel, called the guiding channel, is related in some way to the transport channel on another channel, called the guiding channel. Thus, a receiver determines the transport format of the guiding channel and then uses this information to determine the transport format of the guided channel. In some scenarios, the transport format of the guiding channel does not completely determine the transport format of the guided channel, and instead only specifies a set of possible transport formats. Various embodiments disclosed herein use metrics generated by a decoder at the receiver to select, from among these possible transport formats, the format actually used by the transmitter.

Figure 1:
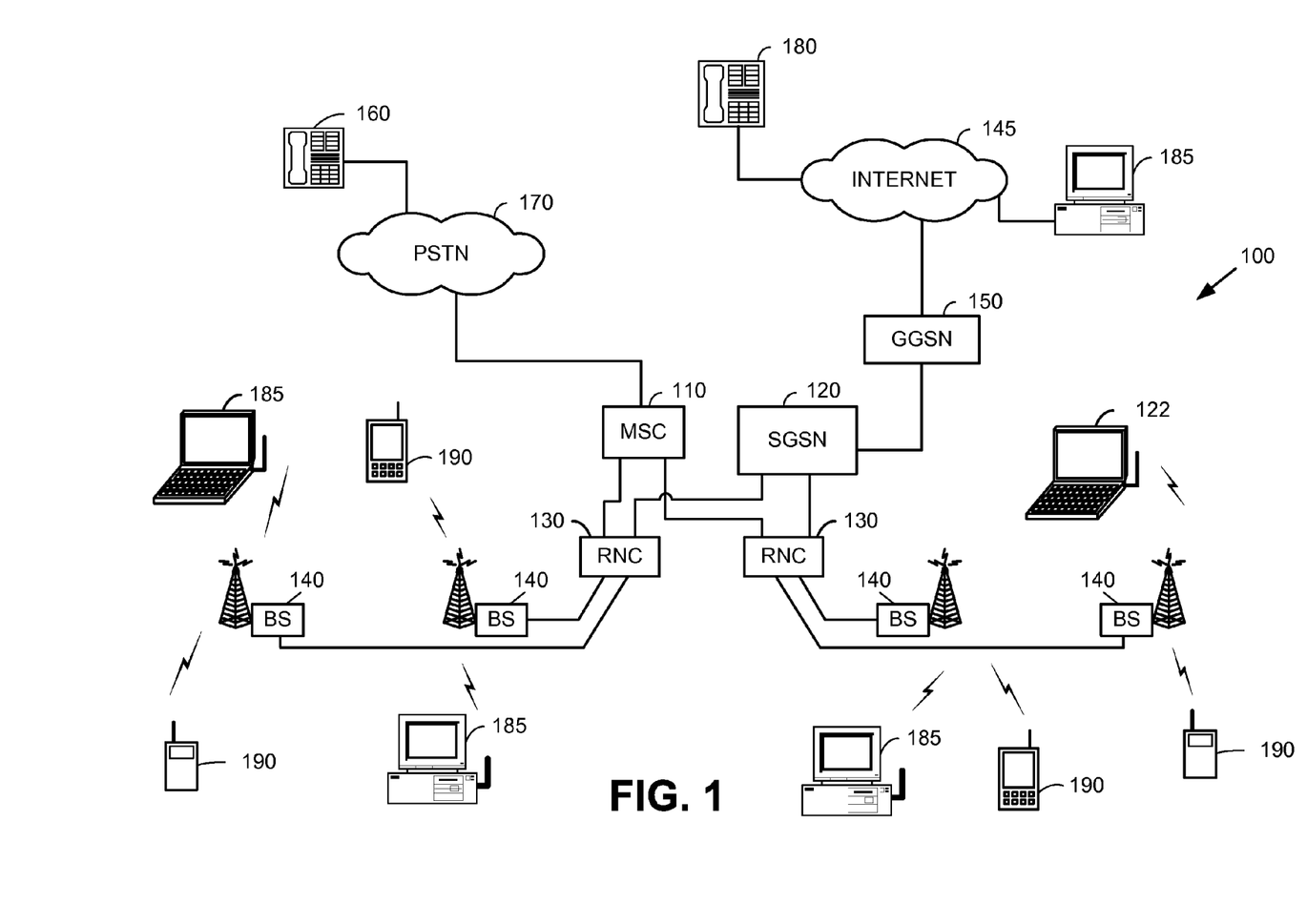
FIG. 1 is a system diagram illustrating a portion of a cellular wireless communication system according to some embodiments of the present disclosure.

FIG. 1 is a system diagram illustrating a portion of a cellular wireless communication system 100 that supports wireless communication devices operating according to some embodiments of the present disclosure. In some embodiments, the cellular wireless communication system 100 supports the 3rd Generation Partnership Project (3GPP) standard, which uses Wideband Code Division Multiple Access (W-CDMA) radio access technology.

The cellular wireless communication system 100 includes a Mobile Switching Center (MSC) 110, Serving GPRS Support Node (SGSN) 120, radio network controllers (RNCs) 130, and base stations 140. The SGSN 120 couples to the Internet 145 via a Gateway GPRS Support Node (GGSN) 150. A conventional voice terminal 160 couples to the Public Switched Telephone Network (PSTN) 170. A Voice over Internet Protocol (VoIP) terminal 180 and a personal computer 185 couple to the Internet 145. The MSC 110 couples to the PSTN 170.

Each of the base stations 140 services a cell/set of sectors within which it supports wireless communications. Wireless links that include both forward link components and reverse link components support wireless communications between the base stations 140 and their serviced wireless terminals. These wireless links support digital data communications, VoIP communications, and other digital multimedia communications. The cellular wireless communication system 100 may also be backward compatible in supporting analog operations as well.

The cellular wireless communication system 100 includes wireless communication devices 190. Wireless communication devices 190 couple to the cellular wireless communication system 100 via wireless links with the base stations 140. Cellular wireless communication system 100 may include cellular telephones, laptop computers, desktop computers, and data terminals. However, the cellular wireless communication system 100 supports communications with other types of wireless terminals as well. As is generally known, devices such as laptop computers, desktop computers, data terminals, and cellular telephones may be enabled to "surf" the Internet, to transmit and receive data communications such as email, transmit and receive files, and to perform other data operations. Some or all of the wireless terminals may therefore support the GPRS and/or EDGE operating standard as well as supporting the voice servicing portions the GSM standard.

Figure 2:
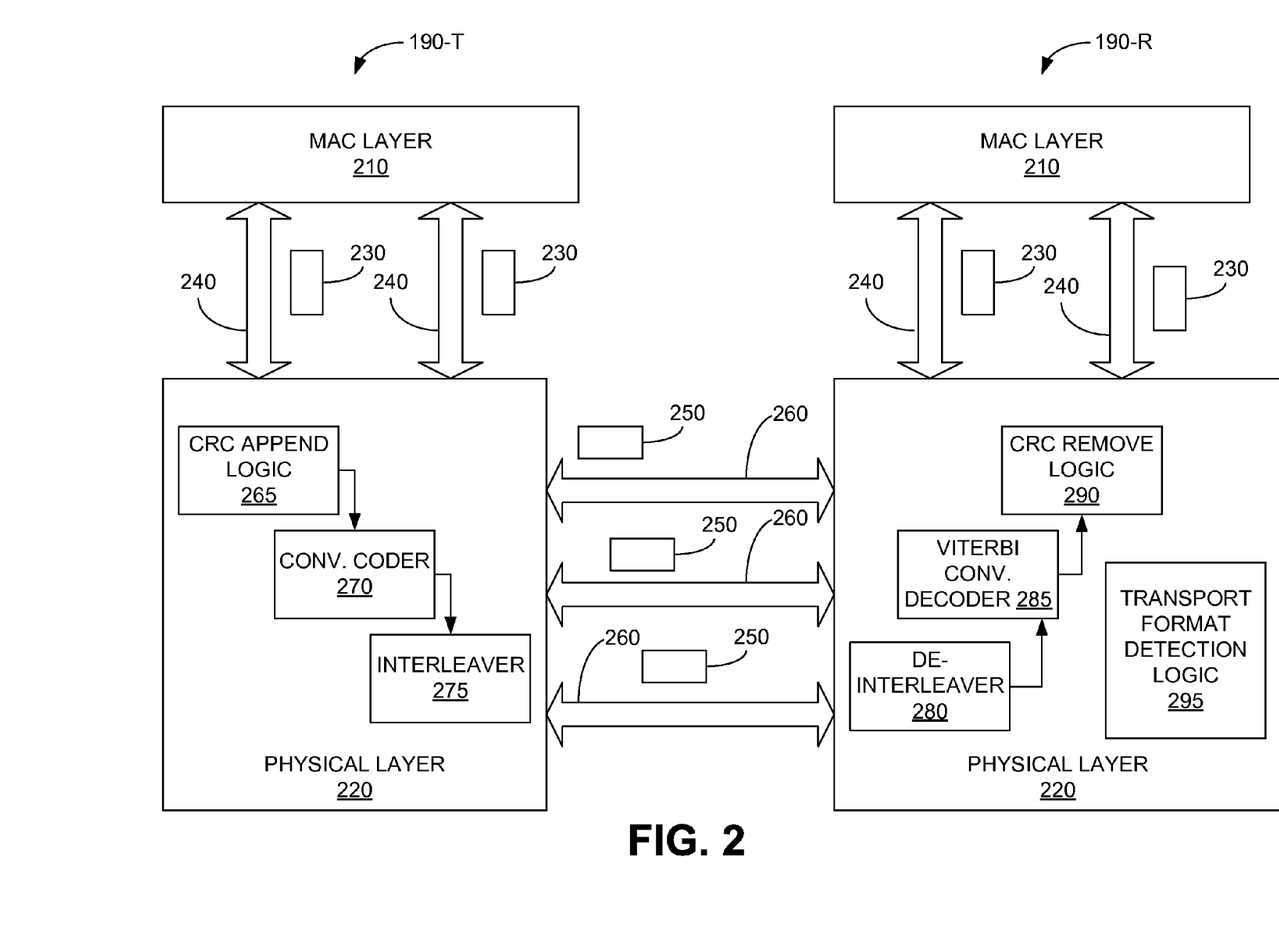
FIG. 2 is a block diagram showing interaction between various functional components of a wireless communication device according to some embodiments of the present disclosure.

FIG. 2 is a block diagram showing interaction between various functional components of a wireless communication device 190, according to some embodiments disclosed herein. A wireless communication device 190 includes a MAC layer 210 and a physical layer 220. In some embodiments, the physical layer 220 is implemented by a baseband processor 620 (see FIG. 6) and the MAC layer 210 is implemented by an application processor 630 (see FIG. 6). However, these functions may be partitioned in other ways, as may be appreciated.

In a transmitting device 190-T, the MAC layer 210 provides data packets 230 to the physical layer 220 via one or more transport channels 240. The physical layer 220 processes these data packets 230 and transmits the resulting frames 250 to a receiving device 190-R over a physical channel 260. In the receiving device 190-R, the physical layer 220 processes the frames 250 to recover the data packets 230, and provides the data packets 230 to the MAC layer 210.

The physical layer 220 receives a data packet 230 from the MAC layer 210 and manipulates the bits in the data packet 230 to make the bits suitable for transmission on the physical channel 260. Such manipulation may include: attaching a CRC, as performed by the CRC append logic 265; generating a convolutional code, as performed by the convolutional coder 270; and interleaving the coded bits, as performed by the interleaver 275. Other operations may be performed on the data packet 230 by the physical layer 220, as may be appreciated.

The modified bit stream is then transmitted on the physical channel 260 and received at the receiving device 190-R. The components in the receiving device 190-R—deinterleaver 280; Viterbi convolutional decoder 285; and CRC remove logic 290)—perform the inverse of the operations in the transmitting device 190-T. The transport channel format detection logic 295 in the receiving device 190-R determines the transport format used by the guided transport channel 240-D using techniques described herein. This transport format in turn determines the size of the data packets 230, which the physical layer 220 uses to provide appropriately-sized data packets 230 are provided to the MAC layer 210.

Figure 3:
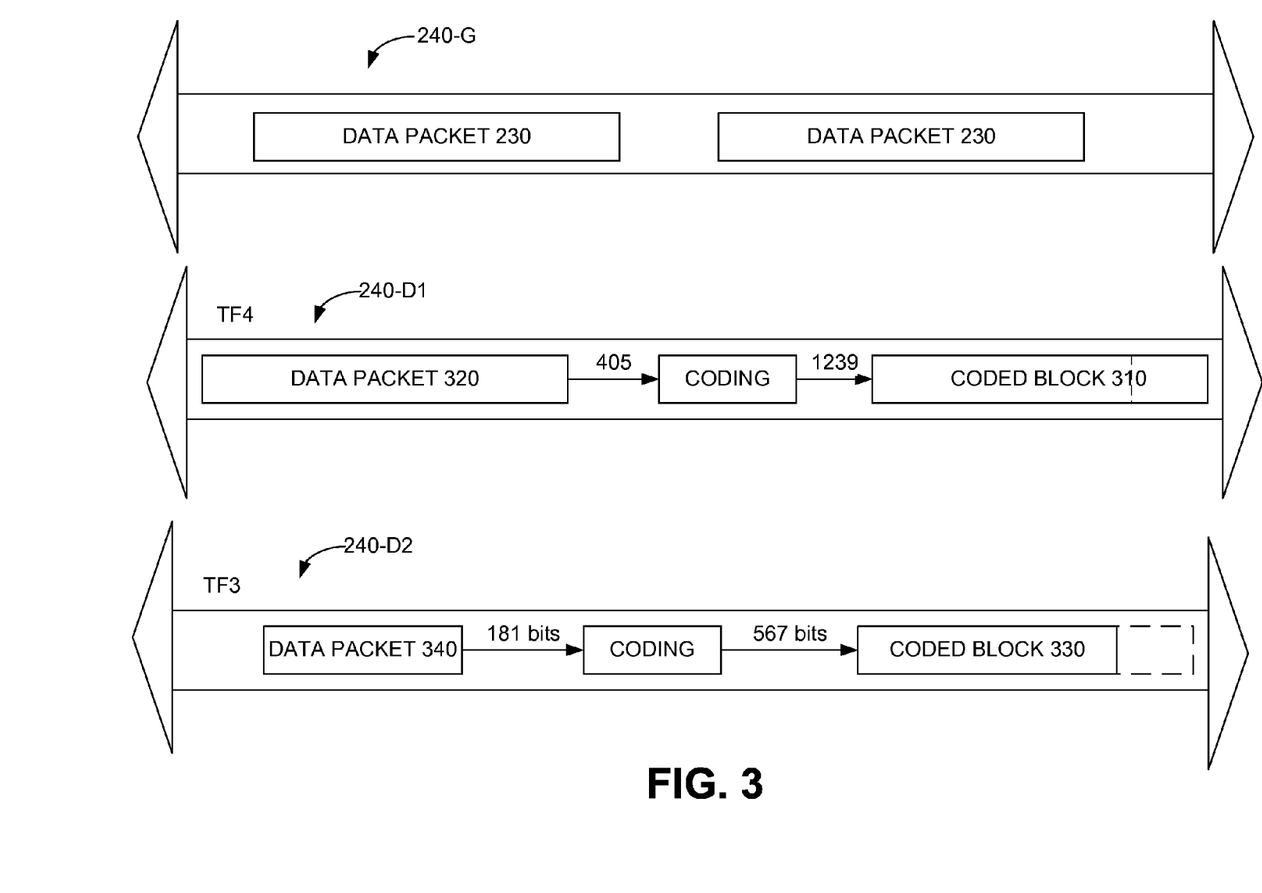
FIG. 3 is a block diagram of transport channels as used by a wireless communication device according to some embodiments of the present disclosure.

FIG. 3 is a block diagram of transport channels as used by a wireless communication device 190 according to some embodiments disclosed herein. In the view shown in FIG. 2, transport channels 240 couple the MAC layer 210 and the physical layer 220. FIG. 3 shows another viewpoint, in which transport channels 240 logically connect the MAC layer 210 of a transmitting device 190-T and the MAC layer 210 of a receiving device 190-R. That is, the physical layer 220 with its physical channel 260 is ignored at this higher level of abstraction.

As shown in FIG. 3, data is transmitted on each transport channel 240 using a particular transport format (TF), which specifies a set of parameters such as coded block size, coding rate, coding scheme, and so on. Two transport channels 240 may be linked such that transport channel format detection logic 295 can use the transport format on one channel, referred to as the guiding transport channel 240-G to determine information about the transport format used by another channel, referred to as the guided transport channel 240-D.

In some cases, the format on the guided transport channel 240-D is completely determined by the format on the guiding transport channel 240-G. In one example of this type of linkage, when the guiding transport channel 240-G uses a Transport Format with a value of 3 (i.e., TF3), this implies that the guided transport channel 240-D uses a Transport Format with a value of 4 (i.e., TF4). In such cases, once the transport channel format detection logic 295 discovers the transport format of the guiding transport channel 240-G, the transport format of the guided transport channel 240-D can be determined.

In other cases, the format on the guiding transport channel 240-G merely implies that the format on the guided transport channel 240-D is one of a predefined set of transport formats, but does not specify which of these formats is used by the guided transport channel 240-D. In one example of this type of linkage, when the guiding transport channel 240-G uses TF3, this implies that the guided transport channel 240-D uses either TF3 or TF4. In such cases, the transport channel format detection logic 295 in the receiving device 190-R determines which of these possible transport formats correspond to the one used by the guided transport channel 240-D.

This choice between transport formats is illustrated in FIG. 3 by two hypothetical or alternative guided channels, 240-D1 and 240-D2. In the scenario illustrated in FIG. 3, Transport Format 3 (TF3) is associated with coding parameters that produce a 1239-bit coded block 310 from a 405-bit data packet 320, and Transport Format 4 (TF4) is associated with coding parameters that produce a 567-bit coded block 330 from a 181-bit data packet 340.

The transport channel format detection logic 295 handles this scenario by decoding the guided channel data according to the coded block size used by hypothetical transport channel 240-D1 and also decoding the guided channel data according to the other coded block size used by the hypothetical transport channel 240-D2. The transport channel format detection logic 295 then uses metrics produced by the Viterbi convolutional decoder 285 to select among the possible transport formats.

As can be seen in FIG. 3, if the receiving device 190-R assumes TF3 (the shorter block size) when the data packet was actually transmitted using TF4 (the longer block size), then the output of the Viterbi convolutional decoder 285 is incorrect. More specifically, the Viterbi convolutional decoder 285 expects coded bits in certain bit positions, but those bit positions will actually contain data bits. The Viterbi convolutional decoder 285 expects a certain sequence of bits, according to the convolutional code, but these bits will not be present since the coded bits are actually distributed among a larger block size. The path metrics produced by the Viterbi convolutional decoder 285 will indicate a low probability of a match with the expected code, and the transport channel format detection logic 295 can use this information to detect that the wrong hypothesis was used, i.e., that the transport channel format detection logic 295 incorrectly assumed TF3 and the actual transport format was instead TF4.

On the other hand, if the receiving device 190-R assumes TF4 (the longer block size) when the data packet was actually transmitted using TF3 (the shorter block size), then the output of the Viterbi convolutional decoder 285 is incorrect. Once again, the Viterbi convolutional decoder 285 expects coded bits in certain bit positions, but those bit positions will actually contain data bits. The Viterbi convolutional decoder 285 expects a certain sequence of bits, according to the convolutional code, but these bits will not be present since the coded bits are actually distributed among a smaller block size. The path metrics produced by the Viterbi convolutional decoder 285 will indicate a low probability of a match with the expected code, and the transport channel format detection logic 295 can use this information to detect that the wrong hypothesis was used, i.e., that the transport channel format detection logic 295 incorrectly assumed TF4 and the actual transport format was instead TF3.

Figure 4:
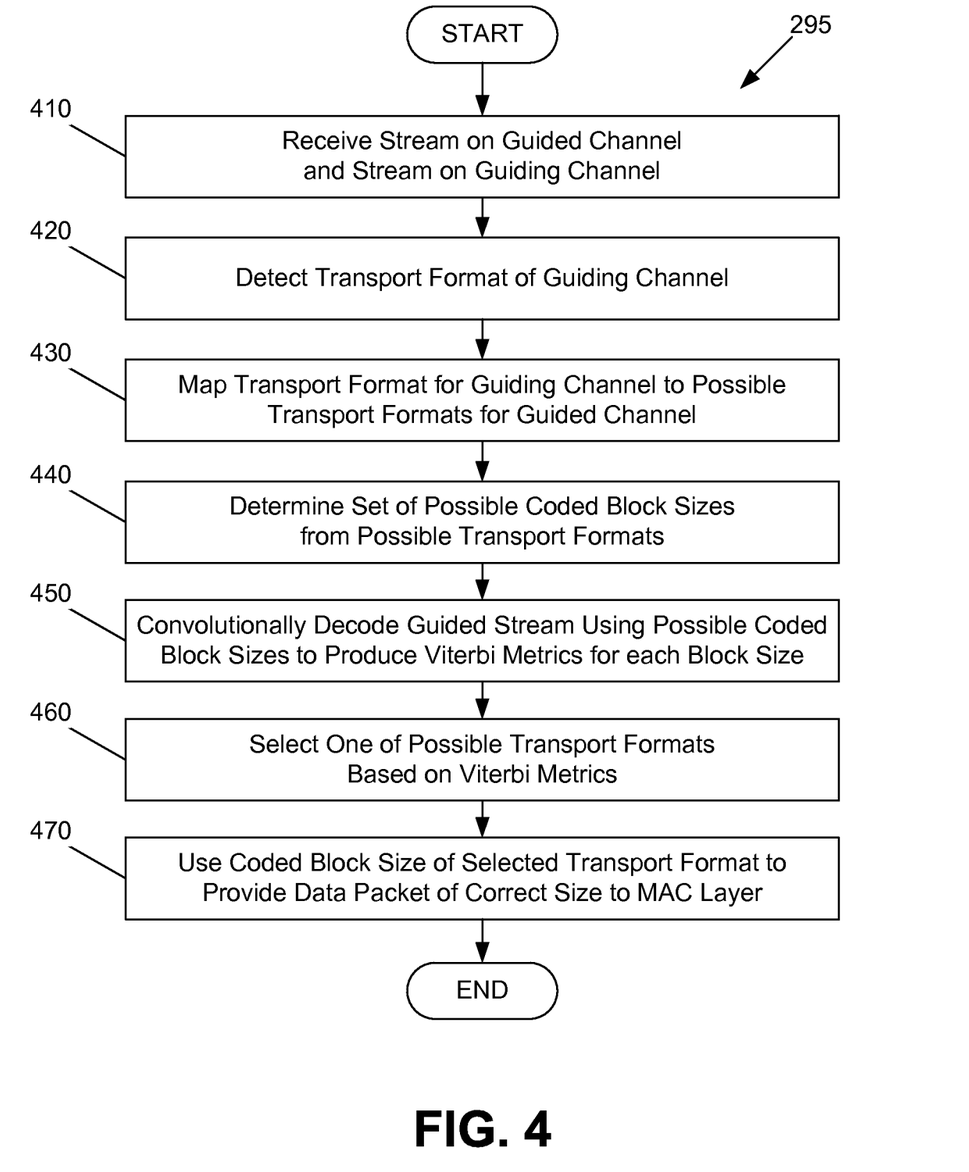
FIG. 4 is a flow chart of the process of detecting the transport format of a transport channel according to some embodiments of the present disclosure.

FIG. 4 is a flow chart of the process of detecting the transport format of a transport channel, according to some embodiments disclosed herein. The flowchart provides one example of operation of the transport channel format detection logic 295 according to various embodiments. Alternatively, the flowchart of FIG. 4 may be viewed as implementing various steps of a method to detect a transport format of a transport channel as performed by an RF transceiver 610, a baseband processor 620, and/or other components in a wireless communication device 190.

At box 410, the transport channel format detection logic 295 receives a number of bits on a guiding transport channel 240-G. In some embodiments, these bits are provided by the RF transceiver 610. Next, at box 420, the detection logic 295 detects the transport format used on the guiding transport channel 240-G. In some embodiments, the detection logic 295 processes the guiding transport channel bitstream received at box 410 and uses a technique known as "blind detection" to determine the transport format. In other embodiments, information about the transport format may be carried on the physical channel in the form of Transport Format Combination Indicator (TFCI) bits, and in such embodiments the detection logic 295 may utilize information provided by the physical layer 220 to determine the transport format for the guiding transport channel 240-G.

At box 430, the transport channel format detection logic 295 maps the transport format of the guiding transport channel 240-G, detected at box 420, to a set of possible transport channel formats used by the guided transport channel 240-D. The detection logic 295 has prior knowledge of such mappings, and may retrieve such mappings from storage. Next, at box 440, the detection logic 295 determines a coded block specified by each of the possible transport channel formats.

Once a set of possible coded block sizes for the guided transport channel 240-D is determined, at box 450 the Viterbi convolutional decoder 285 convolutionally decodes bits on the guided transport channel 240-D. Next, at box 460 the transport channel format detection logic 295 uses the Viterbi path metrics generated at box 450 to identify one of the possible transport channel formats as the format used by the transmitter. At box 470, the baseband processor 620 uses the identified transport format to determine the block size of the data packet, and passes the data packet up to the MAC layer 210.

As noted above, the transport channel format detection logic 295 selects one transport format from among a set of possible transport formats by testing various hypotheses. The receiver 190-R first decodes the guided bitstream according to the hypothesis that the transmitter 190-T used the format with the shortest coded block size. The receiver 190-R then decodes the guided bitstream according the hypothesis that the transmitter 190-T used the format with the next-shortest coded block size, and so on, until a complete decode is performed with the longest coded block size. The transport channel detection logic 295 then uses Viterbi path metrics collected during the decode of each hypothesis to determine which hypothesis is most likely. The generation of decoder metrics and use these metrics to select a transport channel format will now be described in further detail.

Figure 5A:
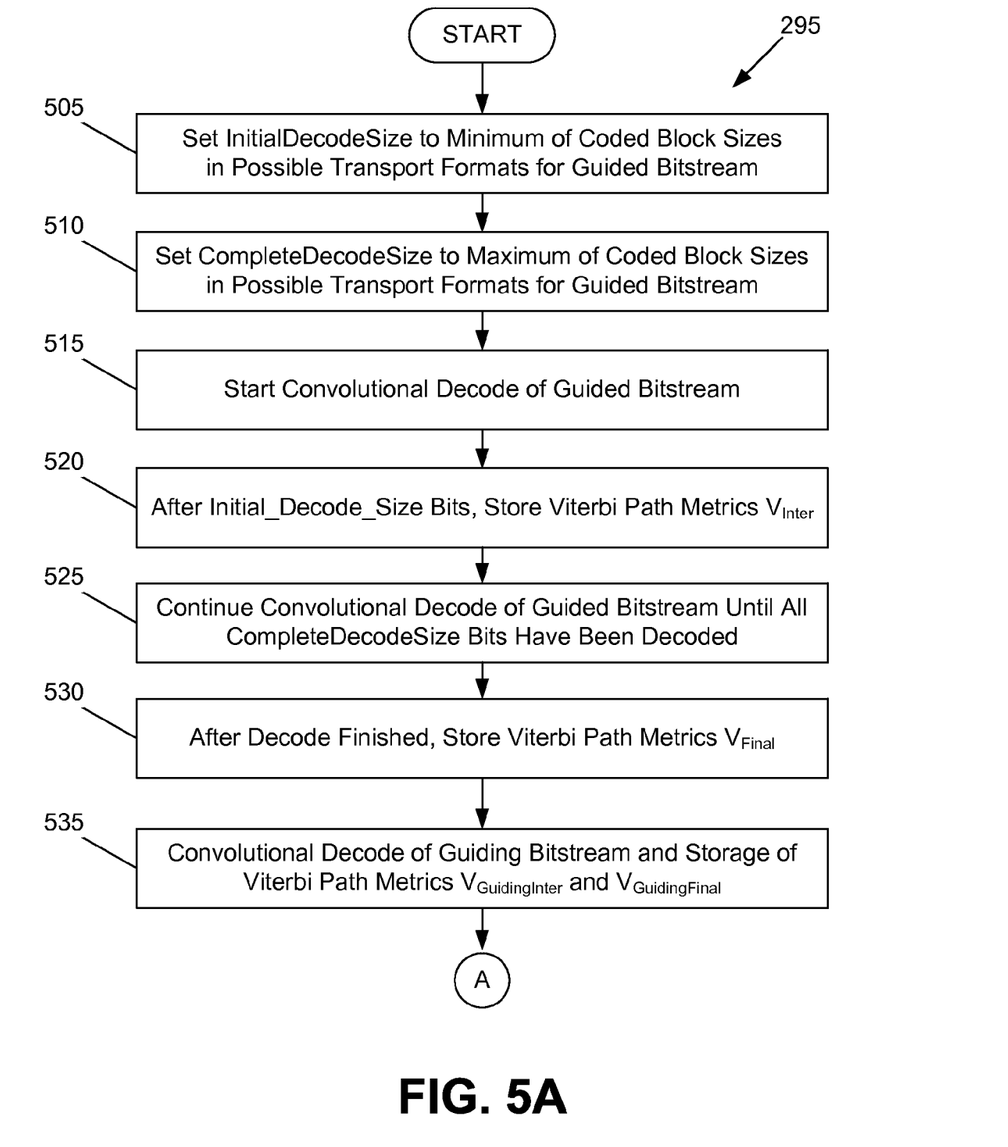
FIGS. 5A and 5B form another flow chart of the process of detecting the transport format of a transport channel according to some embodiments of the present disclosure.
Figure 5B:
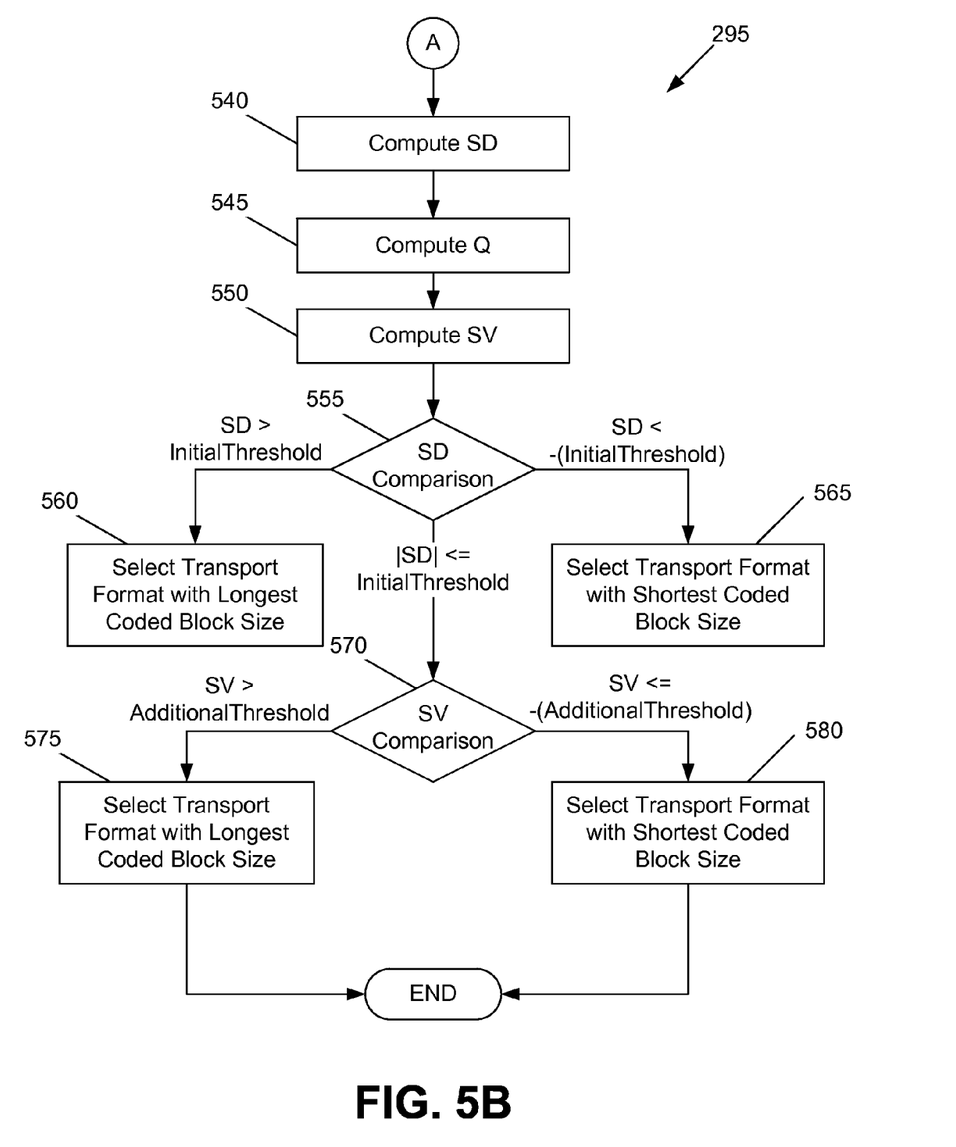

FIGS. 5A and 5B form a flow chart of the process of detecting the transport format of a transport channel, according to some embodiments disclosed herein. The flowchart provides one example of operation of the transport channel format detection logic 295 according to various embodiments. Alternatively, the flowchart of FIGS. 5A and 5B may be viewed as implementing various steps of a method to detect a transport format of a transport channel as performed by an RF transceiver 610, a baseband processor 620, and/or other components in a wireless communication device 190.

The transport channel format detection logic 295 begins by preparing for a convolutional decode of the already-received guided bitstream. As noted earlier, the transport channel format detection logic 295 uses Viterbi metrics collected by the Viterbi convolutional decoder 285 as the bitstream is decoded. At box 505, the transport channel format detection logic 295 examines the set of possible coded block sizes for the guided bitstream and sets InitialDecodeSize to the minimum of these block sizes. As noted above, the set of possible coded block sizes is mapped from the set of possible transport formats. At box 510 the transport channel format detection logic 295 sets CompleteDecodeSize to the maximum of the possible coded block sizes.

Next, at box 515, the transport channel format detection logic 295 instructs the Viterbi convolutional decoder 285 to begin decoding the guided bitstream. At box 520, the transport channel format detection logic 295 retrieves the Viterbi path metrics after InitialDecodeSize bits have been decoded. These metrics may be stored as intermediate Viterbi path metrics, referred to herein as $V_{inter}$. In some embodiments, the retrieved intermediate Viterbi path metrics include the initial path metric V(0), the minimum path metric V(min) and the maximum path metric V(max). These metrics correspond to the initial, minimum, and maximum metrics after an initial stage of decoding the guided bitstream.

At box 525, the Viterbi convolutional decoder 285 continues to decode the guided bitstream. At box 530, the transport channel format detection logic 295 retrieves the Viterbi path metrics after the guided bitstream has been completely decoded, i.e., after CompleteDecodeSize bits. These metrics may be stored as final Viterbi path metrics, referred to herein as $V_{Final}$. Thus, $V_{Final}$ includes the Viterbi path metrics after a final stage of decoding the guided bitstream. In some embodiments, the retrieved final Viterbi path metrics correspond to the intermediate Viterbi path metrics. In such embodiments, for example, if $V_{inter}$ includes V(min) and V(max) for the initial stage of decoding, then $V_{Final}$ includes V(min) and V(max) for the final state of decoding.

In this embodiment, the transport channel format detection logic 295 at box 535 instructs the Viterbi convolutional decoder 285 to decode the guiding bitstream. During the decode, the transport channel format detection logic 295 retrieves the intermediate and final Viterbi path metrics for the guiding bitstream. These metrics may be stored as guiding Viterbi path metrics, referred to herein as $V_{GuidingInter}$ and $V_{GuidingFinal}$. The additional metrics obtained at box 535 can be used, in addition to the guided Viterbi path metrics, to aid in selecting among the possible transport metrics. However, other embodiments do not use guiding Viterbi path metrics.

Turning to FIG. 5B, at box 540, the transport channel format detection logic 295 computes a new Viterbi state metric SD which combines metrics from intermediate and final stages of the decoded guided bitstream. In some embodiments, the computation at box 540 is:

$$SD = \text{zero\_min}(V_{Inter})/\text{max\_min}(V_{Inter}) - \text{zero\_min}(V_{Final})/\text{max\_min}(V_{Final}),$$

where max_min=$V$(max)−$V$(min) and zero_min= $V$(0)−$V$(min).

In this embodiment, the computation of SD involves three different Viterbi path metrics, but other numbers of metrics may be chosen. In this embodiment, the difference between the initial state metric and the minimum state metric is normalized by dividing this difference by another difference (max_min). However, this normalization is optional.

At box 545, the transport channel format detection logic 295 computes another metric, Q, which combines Viterbi path metrics from the guided bitstream with Viterbi path metrics from the guiding bitstream (which was decoded at box 450). In some embodiments, the computation at box 545 is:

$$Q = \frac{\left[\max\_\min(V_{Inter}) + \sum_{i=0}^{i=5} \max\_\min(TFCodeBlockSize_i)\right]}{6}$$

Next, at box 550, the transport channel format detection logic 295 computes another metric, SV, which combines Q with one or more final Viterbi path metrics for the guided bitstream. In some embodiments, the computation of SV at box 550 is $$SV = \max\_\min(V_{Final})/Q$$

Thus, metric SV combines guiding metrics, final guided metrics, and intermediate guided metrics. Notably, the cost of computing SD, Q, and SV is relatively low, since the metrics were already collected as part of the decoding process.

Having computed SD, Q, and SV, the transport channel format detection logic 295 begins the process of using these computed metrics to determine which of the possible transport formats corresponds to the format actually used by the transmitting device 190-T. This particular embodiment uses two predefined thresholds, but other embodiments may use one threshold or more than two thresholds.

At box 555, the transport channel format detection logic 295 compares the SD metric to an initial predefined threshold. If it is determined at box 555 that SD is more than the initial threshold, then at box 560 the transport channel format detection logic 295 identifies the transport format having the longest coded block size as the format actually used by the transmitting device 190-T. If instead it is determined at box 555 that SD is less than the negative of the initial threshold, then at box 565 the transport channel format detection logic 295 identifies the transport format having the shortest coded block size as the format actually used by the transmitting device 190-T. If it is determined at box 555 that SD meets neither of these conditions, then at box 570 the transport channel format detection logic 295 performs another comparison involving SV.

If it is determined at box 570 that SV is more than an additional threshold (separate from the initial threshold), then at box 575 the transport channel format detection logic 295 identifies the transport format having the longest coded block size as the format actually used by the transmitting device 190-T. If instead it is determined at box 570 that SD is less than the negative of the initial threshold, then at box 580 the transport channel format detection logic 295 identifies the transport format having the shortest coded block size as the format actually used by the transmitting device 190-T.

In some embodiments, the initial threshold value is 0.2 and the additional threshold value is 0.6. Such values may be empirically determined by running the algorithm of FIGS. 5A and 5B on simulated or actual transport channels so that the algorithm achieves the desired selectivity. In testing, use of the algorithm with threshold values of 0.2 and 0.6 as results in a sharp decline in the probability of error (Pe) as plotted against the ratio of average energy per PN chip to power transmitted from the base station ($DPCH\_E_C/I_{or}$). Though three particular computed metrics (SD, Q, and SV) were discussed in connection with this embodiment, other combinations involving guiding metrics, final guided metrics, and intermediate guided metrics are also contemplated.

The algorithm discussed of FIGS. 5A and 5B was described in terms of two hypotheses (i.e., two possible coding block sizes and/or transport formats). The two hypothesis embodiment involved one comparison at each threshold, where block 555 is the first threshold comparison and block 570 is the second threshold comparison. In this two hypothesis embodiment, each threshold comparison involves a computed value derived from single pair of metrics: a metric corresponding to the first hypothetical transport format; and metric corresponding to the second hypothetical transport format. In the embodiment described in connection with FIGS. 5A and 5B, that computed value (SD) involves a difference between the zero_min of the shortest block hypothesis and the zero_min of the longest block hypothesis. However, other computed values are possible. Such metrics corresponding to hypothetical transport formats will be referred to as H(i), and the computed values will be referred to as SD(i), where i is the index of possible transport formats.

The two-hypothesis embodiment of FIGS. 5A and 5B may be adapted for other numbers of possible sizes by decoding according to other transport format hypotheses, and storing Viterbi path metrics at the corresponding other intermediate stages during the convolutional decode process. For the generalized multiple hypothesis embodiment, the comparison in blocks 555 and the selection in blocks 560 and 565 can be adapted as follows.

Let $M(i)$=zero_min (TransportFormat($i$))/max_min (TransportFormat($i$)), $I\_smallest$=arg min $\{i=0; i=0$ to $N-1\}$, and $I\_secondsmallest$=arg min $\{M(i); i \neq I\_smallest, i=0$ to $N-1\}$ Block 555 performs the following:
1. If $|M(I\_smallest) - M(I\_secondsmallest)| <=$ InitialThreshold, goto the additional (SV) comparison at block 570.
2. Else, Select Transport Format as TF(I_smallest).

Note that this collapses to the two-hypothesis case: SD= M(1)-M(0), so when SD<-InitialThreshold, the second hypothesis (H1) is selected, or when SD>InitialThreshold, the first hypothesis (H0) is selected.

Figure 6:
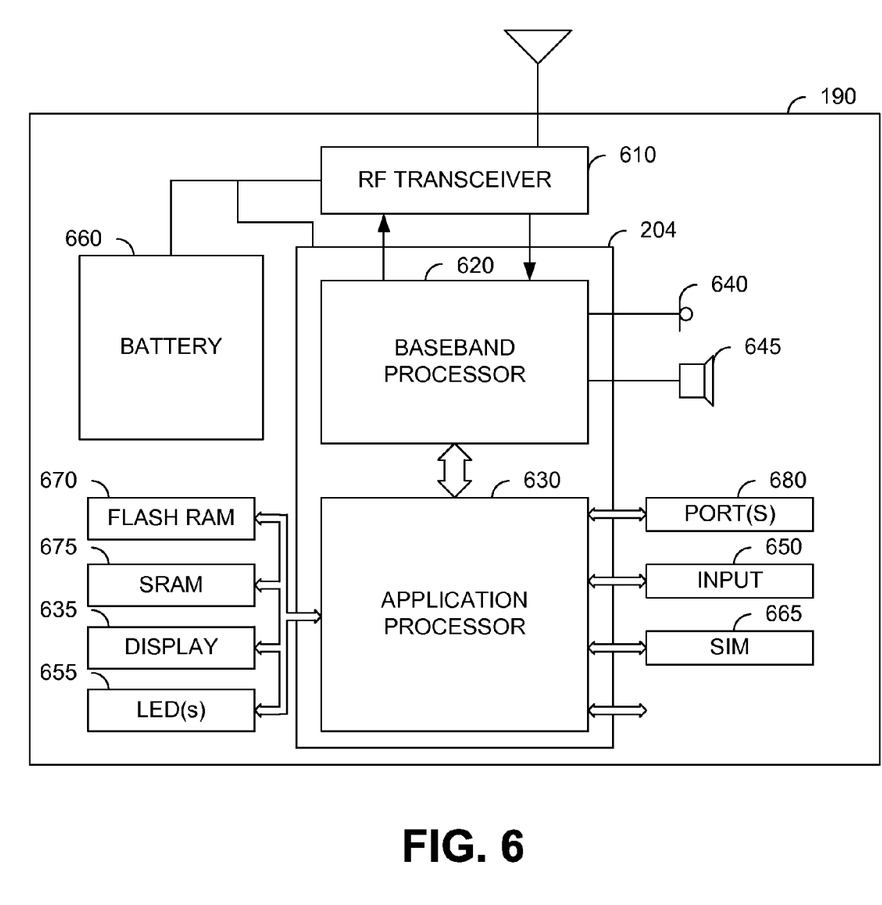
FIG. 6 is a block diagram of a wireless communication device according to some embodiments of the present disclosure.

FIG. 6 is a block diagram of a wireless communication device 190 according to various embodiments of the present disclosure. The wireless communication device 190 of FIG. 6 includes an RF transceiver 610, a baseband processor 620, an application processor 630, and various other components contained within a housing. The baseband processor 620 can perform physical layer processing, include a speech COder/DECoder, and other baseband functions that interact with the RF transceiver 610. In one embodiment, the baseband processor 620 can comprise a Digital Signal Processor (DSP). The application processor 630 can process data provided by the baseband processor 620, which represents decoded information received via the RF transceiver 610, as well as interact with the various other systems and components in the wireless communication device 190, such as a display 635, microphone 640, speaker 645, user input device 650, LED's 655 and other components as can be appreciated that might be incorporated into a mobile device. The user input device 650 can include a capacitive touchscreen that is integrated within the display 635, a keypad, other buttons or switches integrated into the wireless communication device 190, or any other user input device as can be appreciated.

The wireless communication device 190 can also include a battery 660 or other power source that can provide power to the various components in the terminal. The wireless communication device 190 can also include one or more Subscriber Identification Module (SIM) port 665, a flash RAM 670, an SRAM 675, or other system resources. The wireless communication device 190 can also include one or more ports 680, which can comprise a universal serial bus (USB) port and its variants (e.g., micro-USB, mini-USB, etc.), a proprietary port, or any other input/output ports that can provide for data operations as well as power supply that can facilitate charging of the battery 660.

Any logic or application described herein (including the transport channel format detection logic 295) that comprises software or code can be embodied in any non-transitory computer-readable medium for use by or in connection with an instruction execution system such as, for example, a baseband processor 620 or an application processor 630. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Although the transport channel format detection logic 295 and other various systems described herein may be embodied in software or code executed by a processor as discussed above, as an alternative the same may also be embodied in dedicated hardware or a combination of software, general-purpose hardware, and dedicated hardware. If embodied in dedicated hardware, each can be implemented as a circuit or state machine that employs any one of or a combination of a number of technologies. These technologies may include, but are not limited to, discrete logic, a programmable logic device, an application specific integrated circuit (ASIC), a field programmable gate array (FPGA), a system on chip (SoC), a system in package (SiP), or any other hardware device having logic gates for implementing various logic functions upon an application of one or more data signals, Such technologies are generally well known by those skilled in the art and, consequently, are not described in detail herein.

The diagrams of FIGS. 4, 5A and 5B show the functionality and operation of an implementation of portions of the transport channel format detection logic 295. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as the baseband processor 620 in a computer system or other system. The machine code may be converted from the source code, etc. If embodied in hardware, each block may represent a circuit or a number of interconnected circuits to implement the specified logical function(s).

Although the diagrams of FIGS. 4, 5, and 6 show a specific order of execution, it is understood that the order of execution may differ from that which is depicted. For example, the order of execution of two or more blocks may be scrambled relative to the order shown. Also, two or more blocks shown in succession in the diagrams of FIGS. 4, 5A and 5B may be executed concurrently or with partial concurrence. Further, in some embodiments, one or more of the blocks shown in the diagrams of FIGS. 4, 5A and 5B may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure. It is understood that the diagrams of FIGS. 4, 5A and 5B merely provide an example of the many different types of functional arrangements that may be employed to implement the operation of portion(s) of the transport channel format detection logic 295 as described herein. As an alternative, the diagrams of FIGS. 4, 5, and 6 may be viewed as depicting an example of steps of a method implemented in the transport channel format detection logic 295 according to one or more embodiments.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The invention claimed is:

1. A method comprising:
receiving, at a receiver, a guiding stream on a guiding transport channel and a guided stream on a guided transport channel;
convolutionally decoding the guided stream to produce a plurality of Viterbi path metrics; and
selecting a transport format for the guided transport channel from a predefined plurality of possible transport formats that are determined by information provided on the guiding transport channel, based at least in part on a state metric computed from a combination of the Viterbi path metrics, wherein
the state metric comprises a difference between a first operand and a second operand, the first operand being computed using at least one intermediate Viterbi path metric and the second operand being computed using a corresponding final Viterbi path metric.

2. The method of claim 1, wherein the plurality of Viterbi path metrics include at least one of a minimum path metric, a maximum path metric, or a zero path metric.

3. The method of claim 1, wherein:
the plurality of Viterbi path metrics comprise a plurality of intermediate Viterbi path metrics and a plurality of final Viterbi path metrics; and
the convolutionally decoding further comprises convolutionally decoding an initial number of bits in the guided stream to produce the intermediate Viterbi path metrics, the initial number of bits determined using information provided on the guiding transport channel; and convolutionally decoding a final number of bits in the guided stream to produce the final Viterbi path metrics, the final number of bits determined using information provided on the guiding transport channel.

4. The method of claim 3, wherein the first operand comprises a difference between a zero state metric in the intermediate Viterbi path metrics and a minimum state metric in the intermediate Viterbi path metrics.

5. The method of claim 3, wherein the first operand comprises a ratio of a numerator to a denominator, the numerator using a subset of the intermediate Viterbi path metrics and the denominator using an overlapping subset of the intermediate Viterbi path metrics.

6. The method of claim 1, wherein selecting the transport format for the guided transport channel further comprises:
selecting, as the transport format for the guided transport channel, a first one of the possible transport formats if the state metric does not exceed a predefined threshold.

7. The method of claim 6, wherein selecting the transport format for the guided transport channel further comprises:
selecting, as the transport format for the guided transport channel, a second one of the possible transport formats if the state metric equals or exceeds the predefined threshold.

8. The method of claim 1, further comprising convolutionally decoding the guiding stream to produce another plurality of Viterbi path metrics, wherein the selecting of the transport format for the guided transport channel is further based on another state metric computed from a combination of the another Viterbi path metrics.

9. The method of claim 8, wherein selecting the transport format for the guided transport channel further comprises:
if the state metric does not exceed a predefined threshold, comparing the another state metric to another predefined threshold; and
selecting, as the transport format for the guided transport channel, a first one of the possible transport formats if the another state metric exceeds the another predefined threshold and a second one of the possible transport formats if the another state metric does not exceed the another predefined threshold.

10. A device comprising:
a radio frequency (RF) transceiver; and
a baseband processor communicatively coupled to the RF transceiver, the baseband processor configured to:
receive a guiding stream of bits on a guiding transport channel and a guided stream on a guided transport channel;
convolutionally decode the guided stream in a plurality of stages;
generate, at each of the plurality of stages, corresponding sets of Viterbi path metrics $V_i$, where i corresponds to a respective one of the plurality of stages;
compute a state metric from a combination of metrics in the sets of Viterbi path metrics $V_i$; and
select, based on the state metric, a transport format for the guided transport channel from a predefined plurality of possible transport formats, the predefined plurality of possible transport formats being inferred from information on the guiding transport channel, wherein:
the sets of Viterbi path metrics $V_i$, comprise a set of intermediate Viterbi path metrics associated with an intermediate stage of the plurality of stages and a set of final Viterbi path metrics associated with a final stage of the plurality of stages; and
the state metric is computed from at least one of the intermediate Viterbi path metrics and the final Viterbi path metrics.

11. The device of claim 10, wherein the baseband processor is further configured to:
convolutionally decode an initial number of bits in the guided stream to produce the set of intermediate Viterbi path metrics, the initial number of bits being inferred from information on the guiding transport channel; and
convolutionally decode up to a remaining number of bits in the guided stream to produce the set of final Viterbi path metrics, the remaining number of bits being inferred from information on the guiding transport channel.

12. The device of claim 10, wherein the set of intermediate Viterbi path metrics and the set of final Viterbi path metrics each comprise a V(min) path metric, a V(max) path metric, and a V(0) path metric.

13. The device of claim 12, wherein the state metric is computed using a zero_max value and a max_min value, wherein zero_max=V(0)−V(min) and wherein max_min=V(max)−V(min).

14. The device of claim 13, wherein the state metric is computed as a difference between a first ratio and a second ratio, wherein the first ratio is a ratio of values of the set of intermediate Viterbi path metrics, and the second ratio is a ratio of values of the set of final Viterbi path metrics.

15. The device of claim 10, wherein the baseband processor is further configured to:
convolutionally decode the guiding stream to produce another set of Viterbi path metrics;
compute another state metric computed from the another set of Viterbi path metrics; and
compute the state metric further based on the another state metric.

16. The device of claim 15, wherein the another set of Viterbi path metrics comprises V(0), V(max), and V(min) path metrics, and the baseband processor is further configured to:
compute a max_min value of the another set of Viterbi path metrics, wherein max_min=V(max)−V(min);
compute a max_min value of the set of intermediate Viterbi path metrics; and
compute a quality measure from a sum of the max_min value of the another set of Viterbi path metrics and the max_min value of the set of intermediate Viterbi path metrics; and
select the transport format further based on the quality measure.

17. A system comprising:
means for receiving a guiding stream of bits on a guiding transport channel and a guided stream of bits on a guided transport channel;
means for mapping a detected transport format of the guiding stream to a plurality of possible transport formats for the guided stream, each of the possible transport formats associated with a coded block size;
means for convolutionally decoding the guided stream for an initial number of bits specified by the one of the possible transport formats having a shortest coded block size;
means for storing a plurality of intermediate Viterbi path metrics upon convolutionally decoding the initial number of bits;

means for continuing to convolutionally decode the guided stream up to a final number of bits specified by the one of the possible transport formats having a longest coded block size;

means for storing a plurality of final Viterbi path metrics upon convolutionally decoding the final number of bits; and means for selecting a transport format for the guided transport channel from the possible transport formats, based at least in part on a quality measure computed from at least one of the intermediate Viterbi path metrics and at least one of the final Viterbi path metrics.

18. The system of claim 17, wherein the intermediate Viterbi path metrics and the final Viterbi path metrics each comprise a V(min) path metric, a V(max) path metric, and a V(0) path metric.

19. The system of claim 17, further comprising:

means for computing a max_min value of the intermediate Viterbi path metrics; and means for computing a max_min value of the final Viterbi path metrics.

20. The system of claim 19, further comprising:

means for computing a quality measure from a sum of the max_min value of the intermediate Viterbi path metrics and the max_min value of the final Viterbi path metrics; and means for selecting the transport format further based on the quality measure.

* * * * *